(12) United States Patent
Herbsommer et al.

(10) Patent No.: US 9,647,329 B2
(45) Date of Patent: May 9, 2017

(54) ENCAPSULATED MOLDED PACKAGE WITH EMBEDDED ANTENNA FOR HIGH DATA RATE COMMUNICATION USING A DIELECTRIC WAVEGUIDE

(71) Applicant: Texas Instruments Incorporated, Dallas, TX (US)

(72) Inventors: Juan Alejandro Herbsommer, Allen, TX (US); Matthew David Romig, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 200 days.

(21) Appl. No.: 14/585,724

(22) Filed: Dec. 30, 2014

(65) Prior Publication Data
US 2015/0295305 A1    Oct. 15, 2015

Related U.S. Application Data

(60) Provisional application No. 61/977,415, filed on Apr. 9, 2014.

(51) Int. Cl.
*H01Q 1/50* (2006.01)
*H01Q 1/40* (2006.01)
(Continued)

(52) U.S. Cl.
CPC ............. *H01Q 1/40* (2013.01); *H01L 21/561* (2013.01); *H01L 21/78* (2013.01); *H01L 23/495* (2013.01); *H01L 23/49517* (2013.01); *H01L 23/66* (2013.01); *H01L 24/49* (2013.01); *H01L 24/85* (2013.01); *H01L 24/97* (2013.01); *H01Q 19/108* (2013.01); *H01L 23/3121* (2013.01); *H01L 24/48* (2013.01); *H01L 24/73* (2013.01); *H01L 2223/6611* (2013.01);
(Continued)

(58) Field of Classification Search
CPC ........... H01Q 1/40; H01Q 1/50; H01Q 19/108
See application file for complete search history.

(56) References Cited

U.S. PATENT DOCUMENTS 8,304,903 B2    11/2012    Herbsommer et al.
8,714,459 B2 *   5/2014    McCormack ............ H04B 1/40
                                                         235/492

(Continued)

FOREIGN PATENT DOCUMENTS

RU            2507631 C2    2/2014

OTHER PUBLICATIONS

Benjamin S. Cook, et al, "Dielectric Waveguide with Embedded Antenna", U.S. Appl. No. 14/521,443, filed Oct. 22, 2014, pp. 1-42.

*Primary Examiner* — Hoang Nguyen
(74) *Attorney, Agent, or Firm* — John R. Pessetto; Charles A. Brill; Frank D. Cimino

(57) ABSTRACT

An encapsulated integrated circuit has transceiver circuitry operable to produce and/or receive a radio frequency (RF) signal, wherein bond pads on the IC die are coupled to the transceiver input/output (IO) circuitry. An antenna structure is coupled to the IO circuitry via the bond pads. Mold material encapsulates the IC die and the antenna structure, wherein the antenna structure is positioned so as to be approximately in alignment with a core of a dielectric waveguide positioned adjacent the encapsulated IC.

11 Claims, 9 Drawing Sheets

(51) Int. Cl.
- H01L 23/66 (2006.01)
- H01L 23/00 (2006.01)
- H01L 21/56 (2006.01)
- H01L 21/78 (2006.01)
- H01Q 19/10 (2006.01)
- H01L 23/495 (2006.01)
- H01L 23/31 (2006.01)

(52) U.S. Cl.
CPC ............ *H01L 2223/6627* (2013.01); *H01L 2223/6655* (2013.01); *H01L 2223/6677* (2013.01); *H01L 2224/04042* (2013.01); *H01L 2224/05553* (2013.01); *H01L 2224/05599* (2013.01); *H01L 2224/16245* (2013.01); *H01L 2224/16265* (2013.01); *H01L 2224/32245* (2013.01); *H01L 2224/45014* (2013.01); *H01L 2224/45565* (2013.01); *H01L 2224/48091* (2013.01); *H01L 2224/48106* (2013.01); *H01L 2224/48247* (2013.01); *H01L 2224/49171* (2013.01); *H01L 2224/73253* (2013.01); *H01L 2224/73265* (2013.01); *H01L 2224/85399* (2013.01); *H01L 2224/97* (2013.01); *H01L 2924/00014* (2013.01); *H01L 2924/14* (2013.01); *H01L 2924/1421* (2013.01); *H01L 2924/15311* (2013.01); *H01L 2924/181* (2013.01); *H01L 2924/30111* (2013.01)

(56) References Cited

U.S. PATENT DOCUMENTS

| | | |
|---|---|---|
| 2013/0027274 A1 | 1/2013 | Carpentier et al. |
| 2014/0287701 A1* | 9/2014 | Herbsommer ............ H01P 3/16 455/90.2 |
| 2014/0287703 A1 | 9/2014 | Herbsommer |

* cited by examiner

ENCAPSULATED MOLDED PACKAGE WITH EMBEDDED ANTENNA FOR HIGH DATA RATE COMMUNICATION USING A DIELECTRIC WAVEGUIDE

CLAIM OF PRIORITY UNDER 35 U.S.C. 119(e)

The present application claims priority to and incorporates by reference U.S. Provisional Application No. 61/977,415 filed Apr. 9, 2014, entitled "Encapsulated Molded Package With Embedded Antenna For High Data Rate Communication Using A Dielectric Waveguide."

FIELD OF THE INVENTION

This invention generally relates to wave guides for high frequency signals, and in particular to waveguides with dielectric cores.

BACKGROUND OF THE INVENTION

In electromagnetic and communications engineering, the term waveguide may refer to any linear structure that conveys electromagnetic waves between its endpoints. The original and most common meaning is a hollow metal pipe used to carry radio waves. This type of waveguide is used as a transmission line for such purposes as connecting microwave transmitters and receivers to their antennas, in equipment such as microwave ovens, radar sets, satellite communications, and microwave radio links.

A dielectric waveguide employs a solid dielectric core rather than a hollow pipe. A dielectric is an electrical insulator that can be polarized by an applied electric field. When a dielectric is placed in an electric field, electric charges do not flow through the material as they do in a conductor, but only slightly shift from their average equilibrium positions causing dielectric polarization. Because of dielectric polarization, positive charges are displaced toward the field and negative charges shift in the opposite direction. This creates an internal electric field which reduces the overall field within the dielectric itself. If a dielectric is composed of weakly bonded molecules, those molecules not only become polarized, but also reorient so that their symmetry axis aligns to the field. While the term "insulator" implies low electrical conduction, "dielectric" is typically used to describe materials with a high polarizability; which is expressed by a number called the relative permittivity ($\in$k). The term insulator is generally used to indicate electrical obstruction while the term dielectric is used to indicate the energy storing capacity of the material by means of polarization.

Permittivity is a material property that expresses a measure of the energy storage per unit meter of a material due to electric polarization $(J/V^2)/(m)$. Relative permittivity is the factor by which the electric field between the charges is decreased or increased relative to vacuum. Permittivity is typically represented by the Greek letter $\in$. Relative permittivity is also commonly known as dielectric constant.

Permeability is the measure of the ability of a material to support the formation of a magnetic field within itself in response to an applied magnetic field. Magnetic permeability is typically represented by the Greek letter $\mu$.

The electromagnetic waves in a metal-pipe waveguide may be imagined as travelling down the guide in a zig-zag path, being repeatedly reflected between opposite walls of the guide. For the particular case of a rectangular waveguide, it is possible to base an exact analysis on this view. Propagation in a dielectric waveguide may be viewed in the same way, with the waves confined to the dielectric by total internal reflection at its surface.

BRIEF DESCRIPTION OF THE DRAWINGS

Particular embodiments in accordance with the invention will now be described, by way of example only, and with reference to the accompanying drawings.

Figure 1:
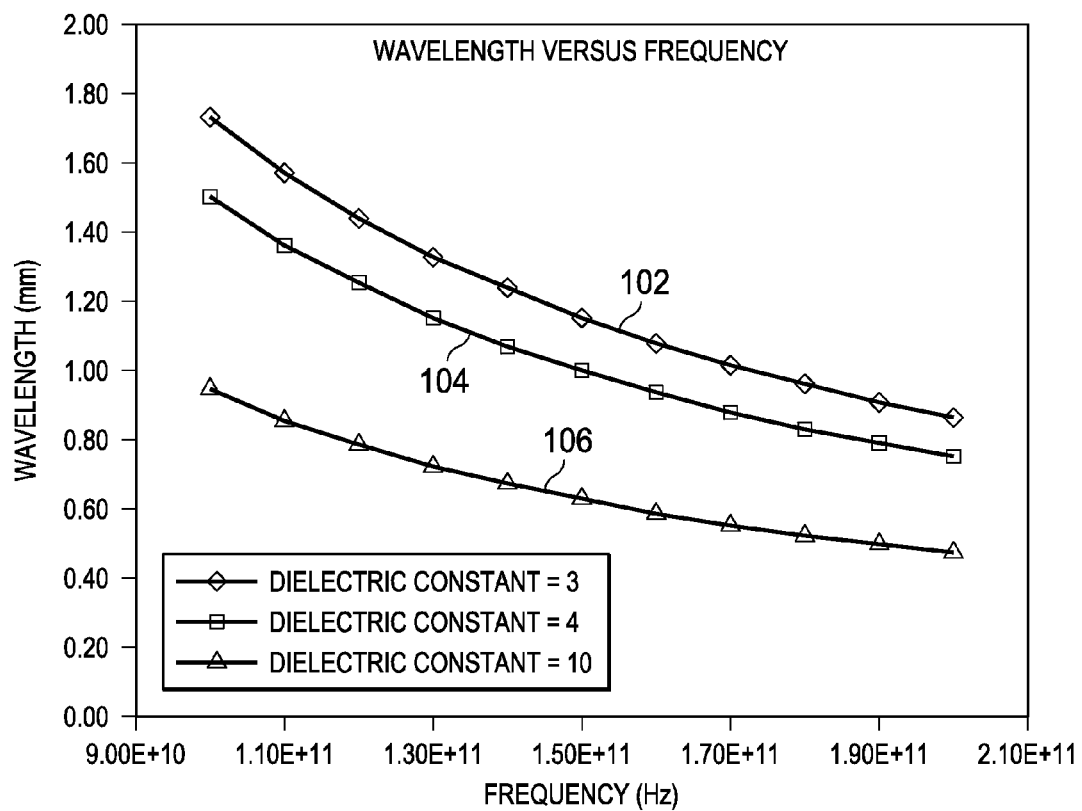
FIG. 1 is a plot of wavelength versus frequency through materials of various dielectric constants.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Dielectric waveguides (DWG) are now used in various ways for communication between different nodes in a system. Embodiments of the present invention may allow launching and/or receiving a signal by an integrated circuit (IC) transceiver to/from a DWG using standard packaging technology in which a launching antenna is embedded within the packaged IC.

As frequencies in electronic components and systems increase, the wavelength decreases in a corresponding manner. For example, many computer processors now operate in the gigahertz realm. As operating frequencies increase sub-terahertz, the wavelengths become short enough that signal lines that exceed a short distance may act as an antenna and signal radiation may occur. FIG. 1 is a plot of wavelength versus frequency through materials of various dielectric constants. As illustrated by plot 102 which represents a material with a low dielectric constant of 3, such as a printed circuit board, a 100 GHz signal will have a wavelength of approximately 1.7 mm. Thus, a signal line that is only 1.7 mm in length may act as a full wave antenna and radiate a significant percentage of the signal energy. In fact, even lines of $\lambda/10$ are good radiators, therefore a line as short as 170 um may act as a good antenna at this frequency.

Waves in open space propagate in all directions, as spherical waves. In this way they lose their power proportionally to the square of the distance; that is, at a distance R from the source, the power is the source power divided by R squared. A wave guide may be used to transport high frequency signals over relatively long distances. The waveguide confines the wave to propagation in one dimension, so that under ideal conditions the wave loses no power while propagating. Electromagnetic wave propagation along the axis of the waveguide is described by the wave equation, which is derived from Maxwell's equations, and where the wavelength depends upon the structure of the waveguide, and the material within it (air, plastic, vacuum, etc.), as well as on the frequency of the wave. Commonly-used waveguides are only of a few categories. The most common kind of waveguide is one that has a rectangular cross-section, one that is usually not square. It is common for the long side of this cross-section to be twice as long as its short side. These are useful for carrying electromagnetic waves that are horizontally or vertically polarized.

For the exceedingly small wavelengths encountered for sub-THz radio frequency (RF) signals, dielectric waveguides perform well and are much less expensive to fabricate than hollow metal waveguides. Furthermore, a metallic waveguide has a frequency cutoff determined by the size of the waveguide. Below the cutoff frequency there is no propagation of the electromagnetic field. Dielectric waveguides may have a wider range of operation without a fixed cutoff point. However, a purely dielectric waveguide may be subject to interference caused by touching by fingers or hands, or by other conductive objects. Metallic waveguides confine all fields and therefore do not suffer from EMI (electromagnetic interference) and cross-talk issues; therefore, a dielectric waveguide with a metallic cladding may provide significant isolation from external sources of interference. Various types of dielectric core waveguides will be described in more detail below.

Figure 2:
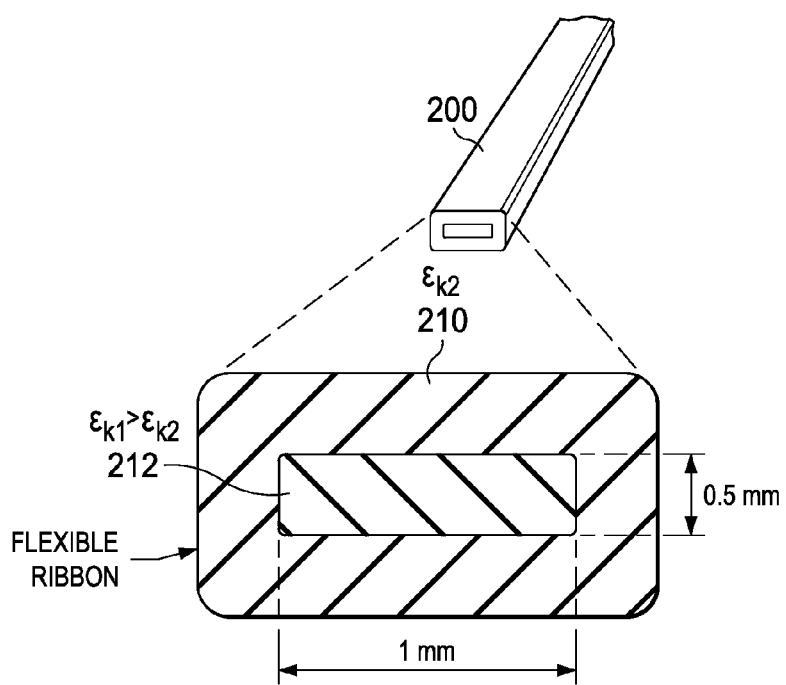
FIG. 2 is an illustration of an example prior art dielectric waveguide.

FIG. 2 illustrates a prior art DWG 200 that is configured as a thin ribbon of a core dielectric material surrounding by a dielectric cladding material. The core dielectric material has a dielectric constant value $\in 1$, while the cladding has a dielectric constant value of $\in 2$, where $\in 1$ is greater than $\in 2$. In this example, a thin rectangular ribbon of the core material 212 is surrounded by the cladding material 210. For sub-terahertz signals, such as in the range of 130-150 gigahertz, a core dimension of approximately 0.5 mm×1.0 mm works well. DWG 200 may be fabricated using known extrusion techniques, for example.

Various configurations of dielectric waveguides (DWG) and interconnect schemes are described in US Patent Publication number 2014-0287701, published Sep. 25, 2014, entitled "Integrated Circuit with Dipole Antenna Interface for Dielectric Waveguide" by Juan Herbsommer, et al, and are incorporated by reference herein. Various antenna configurations for launching and receiving radio frequency signals to/from a DWG are also described therein and are incorporated by reference herein.

Example use cases for the DWG concept described in US Patent Publication number 2014-0287701 include a silicon die packaged in a flip chip ball grid array (BGA) where the launch structures (antenna) from the die into the waveguide are printed on the package substrate. The die may be bumped and mounted to the package substrate and the packaged device mounted to a PCB. Various launch configurations include: end-launch, top-launch, and bottom launch antennae, for example.

In some extremely cost sensitive applications, the cost overhead of a BGA package may not be tolerated. For these applications, a lower cost solution will now be described to provide a transceiver IC chip and the antenna needed to launch the signal to a dielectric waveguide used for high data rate communication. In the following examples, an antenna is embedded inside an encapsulated molded package. Different designs may be used for different dielectric waveguide configurations. In the following figures, a QFN (Quad Flat No Lead) package is used as example; however, the same idea may be applied to a more general class of packages. This general class of package may be defined as any plastic molded package which is formed by saw-singulation. Such devices generally have an IC chip mounted on a lead frame or other substrate with routing layer(s), with a mold compound encapsulating the lead frame and IC chip. An antenna structure may be supported within the mold compound and connected electrically to the routing layer or directly to the die.

Specific examples may include QFN, SON (small outline no lead), BGA (ball grid array), LGA (land grid array), flip chip versions of those, embedded-die packages, or fanout wafer-scale packages, for example.

Furthermore, the mold compound may be selected to have a dielectric constant value that is similar to the dielectric material used in a DWG that may be placed next to the package for transferring an RF signal that is transmitted or received by the IC. In this manner, coupling between the DWG and the package may be optimized. Ideally the encapsulant would have the same dielectric characteristics of the core of the dielectric waveguide. Polymer material commonly used to fabricate the dielectric core of a waveguide has a dielectric constant value that is typically in the range of 2.4-12, with lower values being more common and therefore less expensive. A DWG using a commonly available polymer material may have a dielectric constant of approximately 3.0, for example.

As operating frequencies continue to increase and the size of the device package is scaled down, the DWG will need to scale down in the same proportion by using dielectric materials having a higher dielectric constant value; therefore, a higher dielectric constant may be needed for the encapsulant. Typical values of dielectric constant for Epoxy Mold Compound (EMC) are around $\in =4$ and tan $\delta =0.001$-0.01. In order to increase the dielectric constant of the EMC, nanoparticles that have a higher dielectric constant, such as: TiO2 (titanium oxide) or BaTiO3 (barium titanate), may be added to create a composite mold material with enhanced dielectric characteristics that match the dielectric characteristics of the core of the DWG. Such an enhanced composite mold material may have a dielectric constant value in the range of 2.4-60, for example, depending on the amount of nonoparticles added to the EMC. Experiments have shown that composites of BaTiO3+trimethylolpropane triacrylate (TMPTA) with up to 35% BaTiO3 may produce dielectric values in the range of approximately 2.4-30. Similarly, composites of BaTiO3+poly(ethylene glycol) diacrylate (PEGDA) with up to 40% BaTiO3 may produce dielectric values in the range of approximately 2.4-60, for example.

Figure 3:
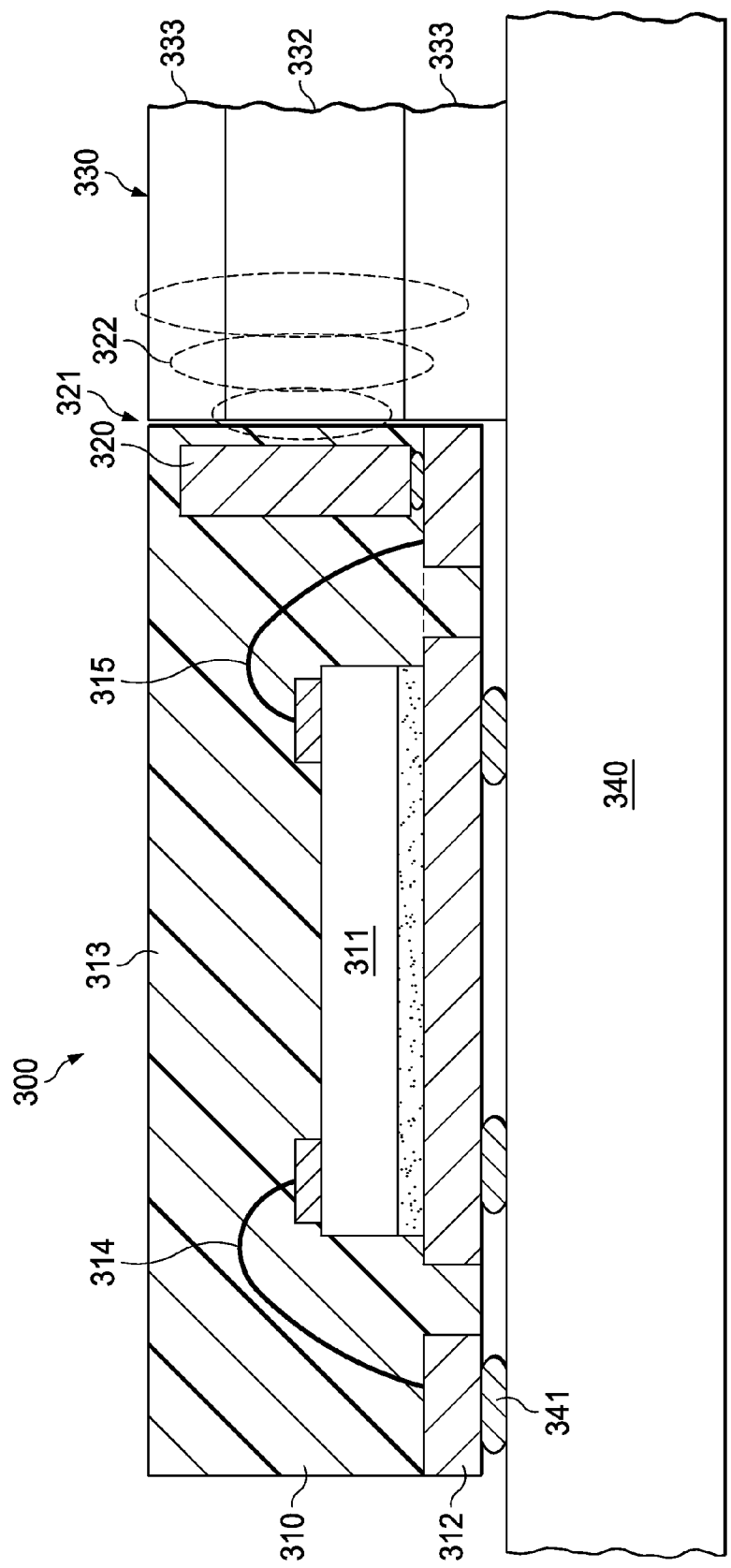
FIGS. 3-8 are illustrations of various embodiments of encapsulated integrated circuits in which an antenna structure for launching sub-THz radio frequency signals is supported by the encapsulation material.

FIG. 3 is a side view of a system 300 with an encapsulated integrated circuit device 310 in which an antenna structure 320 for launching sub-THz radio frequency signals is supported by the encapsulation material 313.

IC chip 311 may be mounted on a lead frame 312. A set of lead wires illustrated generally at 314 may provide electrical signal connection between bond pads on the IC and bond pads on the lead frame, as is well known.

System 300 includes a DWG 330, a small portion of which is illustrated here. DWG 330 includes a dielectric core 332 that runs the length of DWG 330. Dielectric core 332 may be surrounded by a dielectric cladding material 333.

System 300 may also include a substrate 340 such as a printed circuit board on which IC device 310 and DWG 330 are mounted, for example. Leadframe contacts of IC device 310 may be coupled to signal pads on substrate 340 using solder 331, conductive glue, or other known or later developed techniques.

In this example, antenna structure 320 is mounted close to the interface edge 321 of the encapsulated package 310 and may either be connected to a Cu (copper or other suitable conductor) leadframe as illustrated here or connected directly to bond pads of the IC chip 311, for example. The connection of the antenna 320 with the leadframe may be achieved using solder or wire bonds. In the case of using wire bond it is necessary to design this interconnect properly taking into account the impedance added by the wire bond that at sub-THz frequencies could be very large. The bond wire impedance may seriously affect the matching impedance with the antenna and degrade the total power transmitted from the IC to the dielectric waveguide. The total attenuation budget for this interconnect may vary based on the application and the contributions from the other pieces of the signal line such as the chip or the DWG. If the frequency band of application allows the designer to use capacitors, then capacitors may be used to create a resonant structure to minimize the impedance of the wire bonds, for example.

In order to maximize coupling between antenna 320 and DWG 330, antenna 320 is placed near the interface edge 321 of IC package 310 so that and end of DWG 330 may be abutted adjacent IC package 310 with core 332 approximately aligned with antenna 320 so that an RF field 322 radiated by antenna 320 will be largely captured by DWG 330. In order to maximize coupling, the dielectric constant value of encapsulation material 313 may be selected to be approximately the same as the dielectric constant value of DWG core 332. In this manner, impedance matching may be provided across interface boundary 321.

Figure 4:
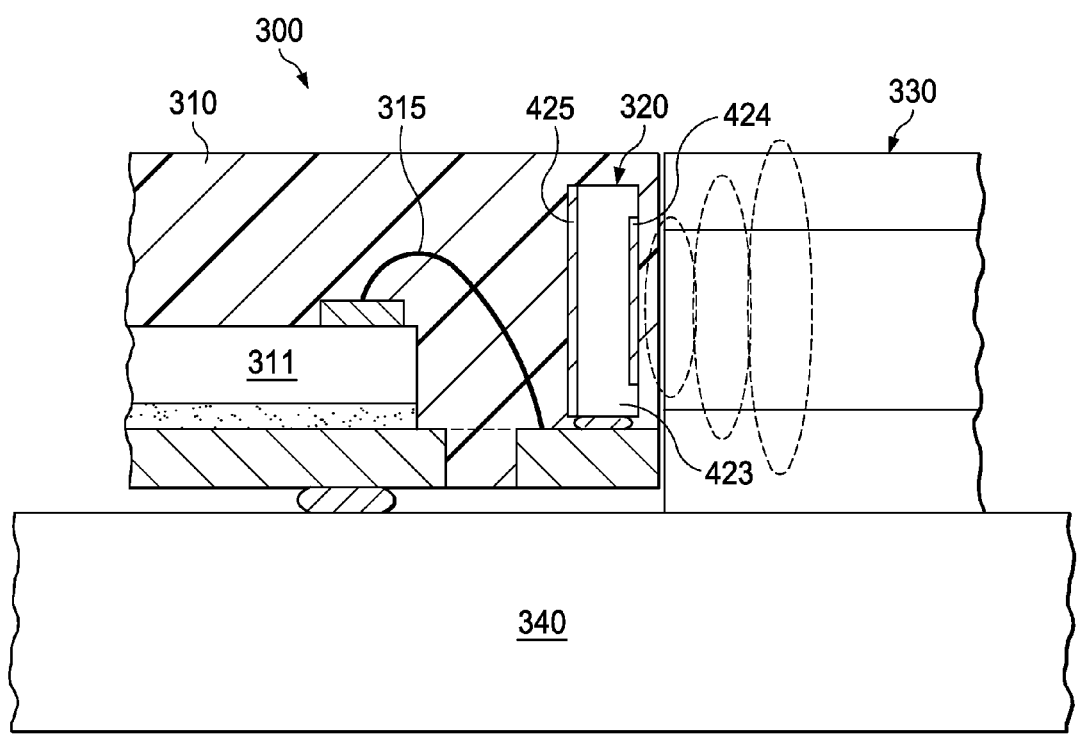

FIG. 4 illustrates antenna structure of IC device 310 of system 300 in more detail. In this example, a multilayer substrate 423 is used to manufacture antenna 320. In order to improve the directivity of the antenna towards the dielectric waveguide, an antenna pattern may be formed Cu layer 424 facing DWG 330 while Cu layer 425 facing IC 311 may be used as a ground layer that will reflect the EM waves towards DWG 330.

Figure 5:
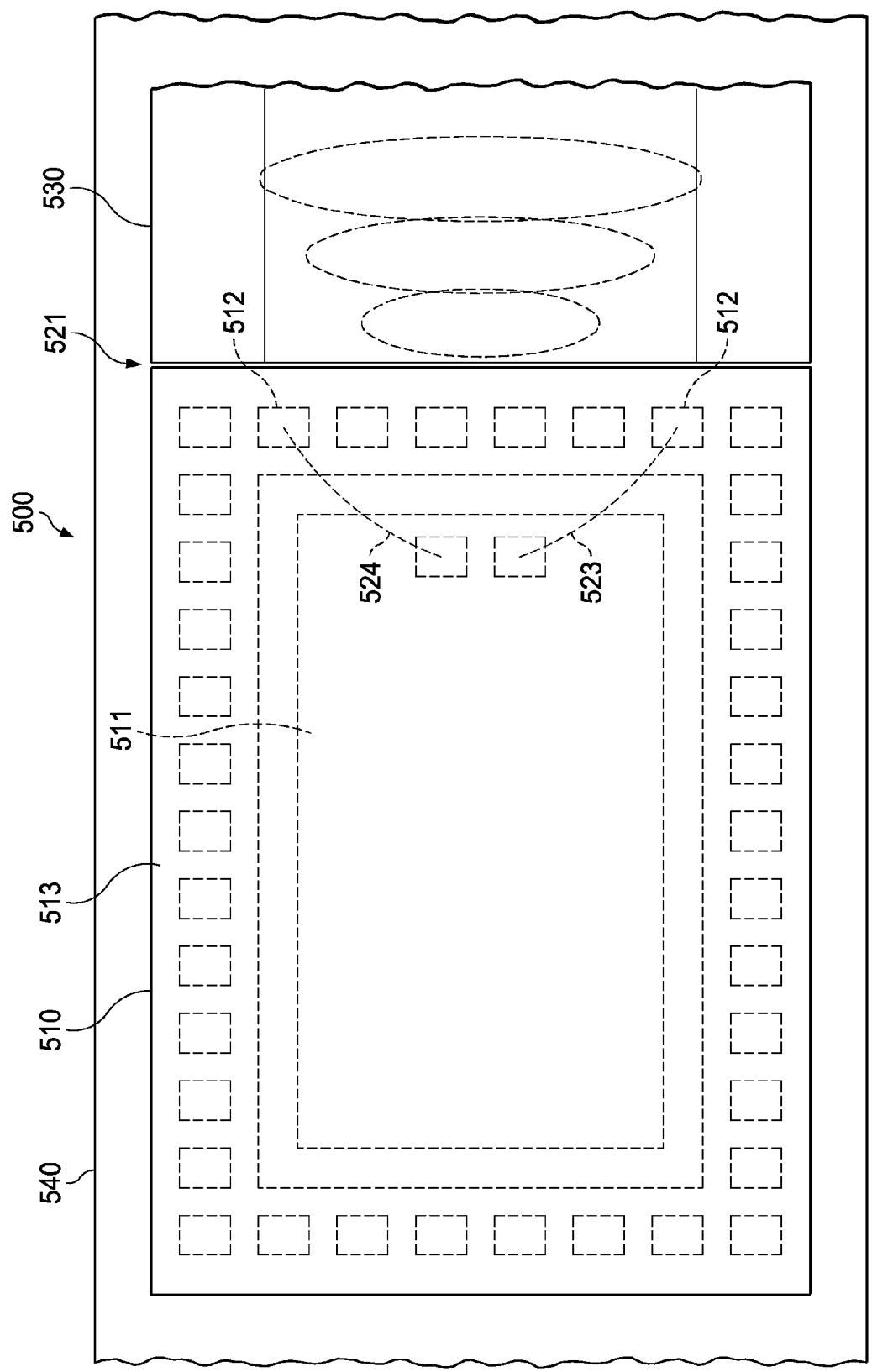

FIG. 5 is a side view of an example system 500 with another embodiment of an encapsulated integrated circuit 510 in which an antenna structure for launching sub-THz radio frequency signals is supported by the encapsulation material 513. As signal frequencies increase, energy may be radiated by the bond wire between the IC and the antenna structure before the signal reaches the antenna. In that case, adding capacitors as described above is useless. In this case, bond wire may be used as an antenna. In this example, bond wires 523, 524 may act as a dipole antenna, for example. In another embodiment, multiple bond wires may be used to form a multi-element antenna, for example. In this example, bond wires 523, 524 are bonded between pads on IC chip 511 and corresponding pads 512 on the leadframe.

In this case, the molded encapsulation will surround the bond wires. As discussed above, in order to maximize coupling, the dielectric constant value of encapsulation material 513 may be selected to be approximately the same as the dielectric constant value of DWG core 532. In this manner, impedance matching may be provided across interface boundary 521 between IC device 510 and DWG 530. As described above in more detail, IC device 510 and DWG 530 may be mounted on a substrate 540, for example.

Figure 6:
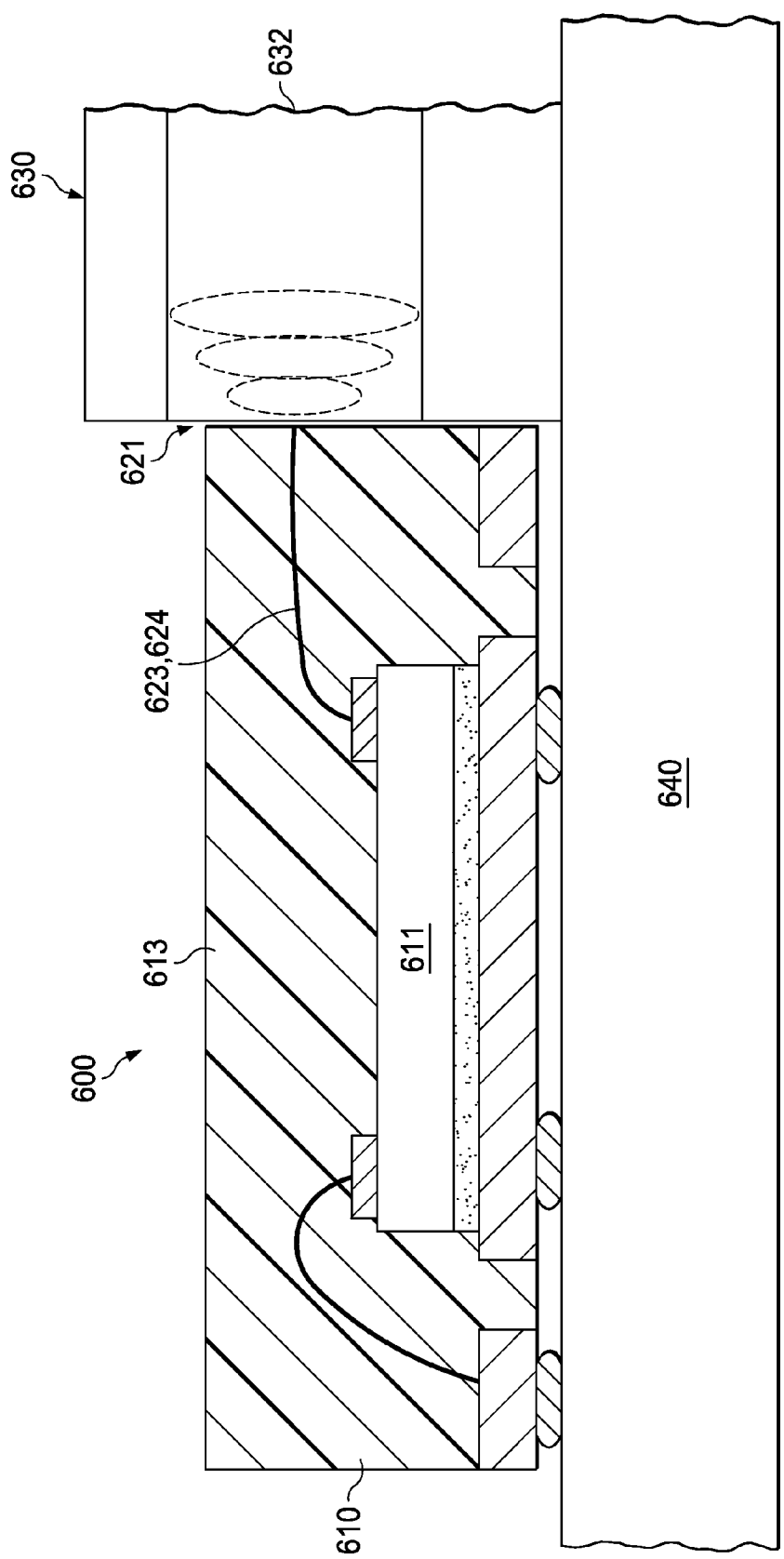

FIG. 6 is a side view of an example system 600 with another embodiment of an encapsulated integrated circuit 610 in which an antenna structure for launching sub-THz radio frequency signals is supported by the encapsulation material 613. Encapsulated IC 610 is similar to IC 510 except that in this example bond wires 623, 624 are bonded to pads on IC chip 611, but are otherwise wholly supported by molding material 613 and are truncated near interface surface 621 of encapsulated IC 610. This allows a dipole antenna to be formed by bonding wires 623, 624 that may lie in a plane that is approximately centered on the core 632 of adjacent DWG 630. In another embodiment, multiple pairs of bond wires may be used to form a multi-element antenna, for example.

In this case, the molded encapsulation will surround the bond wires. As discussed above, in order to maximize coupling, the dielectric constant value of encapsulation material 613 may be selected to be approximately the same as the dielectric constant value of DWG core 632. In this manner, impedance matching may be provided across interface boundary 621 between IC device 610 and DWG 630. As described above in more detail, IC device 610 and DWG 630 may be mounted on a substrate 640, for example.

Figure 7:
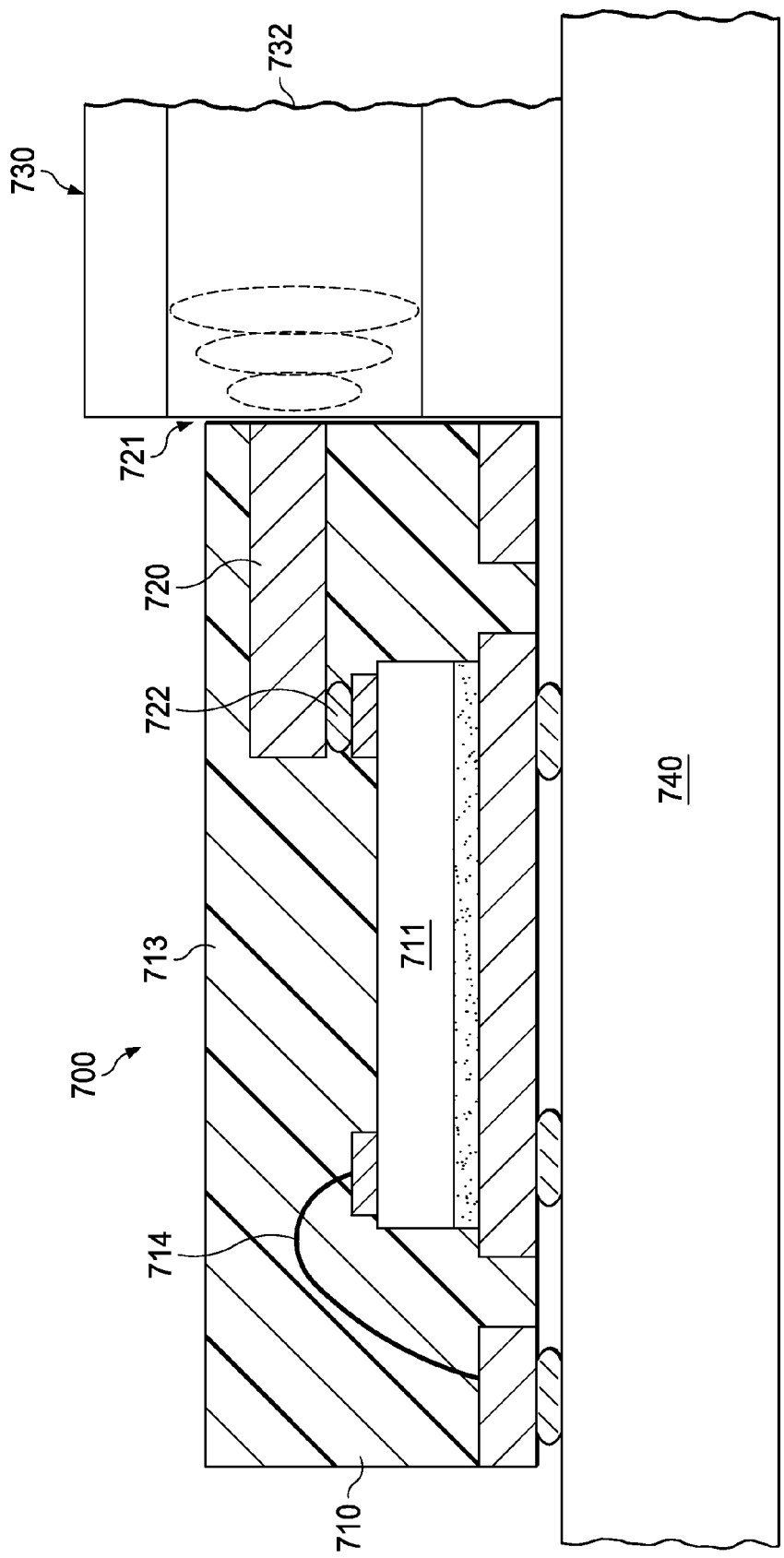

FIG. 7 is a side view of an example system 700 with another embodiment of an encapsulated integrated circuit 710 in which an antenna structure for launching sub-THz radio frequency signals is supported by the encapsulation material 713. Encapsulated IC 710 is similar to IC 610 except that in this example an antenna 720 is formed on a substrate with signal pads bonded to pads on IC chip 711, but is otherwise wholly supported by molding material 713. Solder 722, conductive adhesive, wire bonds, or other known or later developed techniques may be used to conductively couple antenna structure 720 to bond pads on IC chip 711. This configuration achieves close proximity between the die and the antenna structure, which allows for a very short electrical path with reduced inductance, or tighter coupling to other circuit structures such as a ground plane, for example. Antenna structure 720 may be truncated near interface surface 721 of encapsulated IC 710. This allows a dipole antenna or a more complex multi-element antenna to be provided that may lie in a plane that is approximately centered on the core 732 of adjacent DWG 730.

Antenna structure 720 may be made from a copper, or other suitable conductive material, sheet by etching or stamping, for example. Alternatively, antenna structure 720 may be formed on a substrate, such as FR-4 or Getek, for example. FR-4 is a grade designation assigned to glass-reinforced epoxy laminate sheets, tubes, rods and printed circuit boards (PCB). FR-4 is a composite material composed of woven fiberglass cloth with an epoxy resin binder that is flame resistant. Getek has a low dielectric constant value and a low dissipation factor.

In this case, the molded encapsulation will surround the antenna structure 720. As discussed above, in order to maximize coupling, the dielectric constant value of encapsulation material 713 may be selected to be approximately the same as the dielectric constant value of DWG core 732. In this manner, impedance matching may be provided across interface boundary 721 between IC device 710 and DWG 730. As described above in more detail, IC device 710 and DWG 730 may be mounted on a substrate 740, for example.

Figure 8:
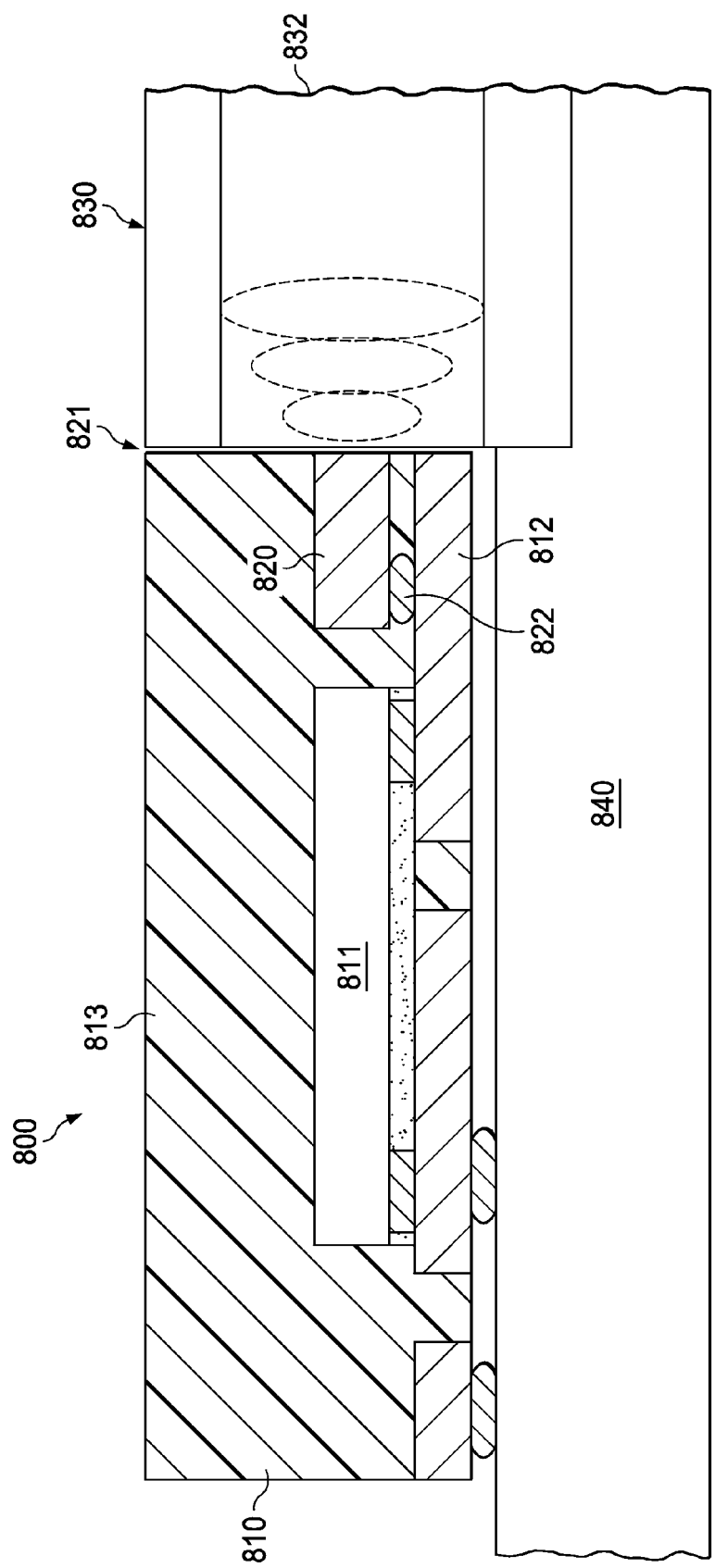

FIG. 8 is a side view of an example system 800 with another embodiment of an encapsulated integrated circuit 810 in which an antenna structure for launching sub-THz radio frequency signals is supported by the encapsulation material 813. Encapsulated IC 810 is similar to IC 710 except that in this example an antenna 820 is formed on a substrate with signal pads bonded to pads on leadframe 812, but is otherwise wholly supported by molding material 813. Solder 822, conductive adhesive, or other known or later developed techniques may be used to conductively couple antenna structure 820 to signal pads on leadframe 811. Antenna structure 820 may be truncated near interface surface 821 of encapsulated IC 810. This allows a dipole antenna or a more complex multi-element antenna to be provided that may lie in a plane that is approximately centered on the core 832 of adjacent DWG 830.

In this case, the molded encapsulation will surround the antenna structure 820. As discussed above, in order to maximize coupling, the dielectric constant value of encapsulation material 813 may be selected to be approximately the same as the dielectric constant value of DWG core 832. In this manner, impedance matching may be provided across interface boundary 821 between IC device 810 and DWG 830. As described above in more detail, IC device 810 and DWG 830 may be mounted on a substrate 840, for example.

Figure 9:
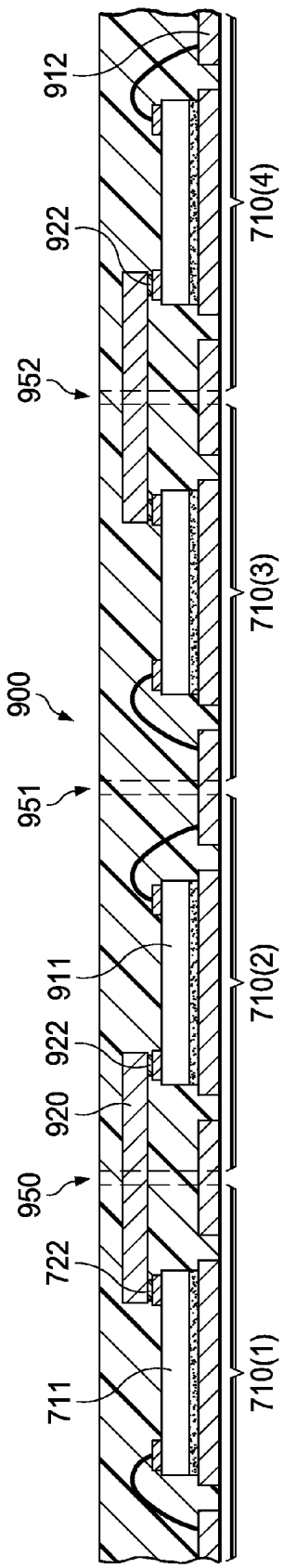
FIGS. 9-10 illustrate a process for manufacturing the devices illustrated in FIGS. 6-8.
Figure 10:
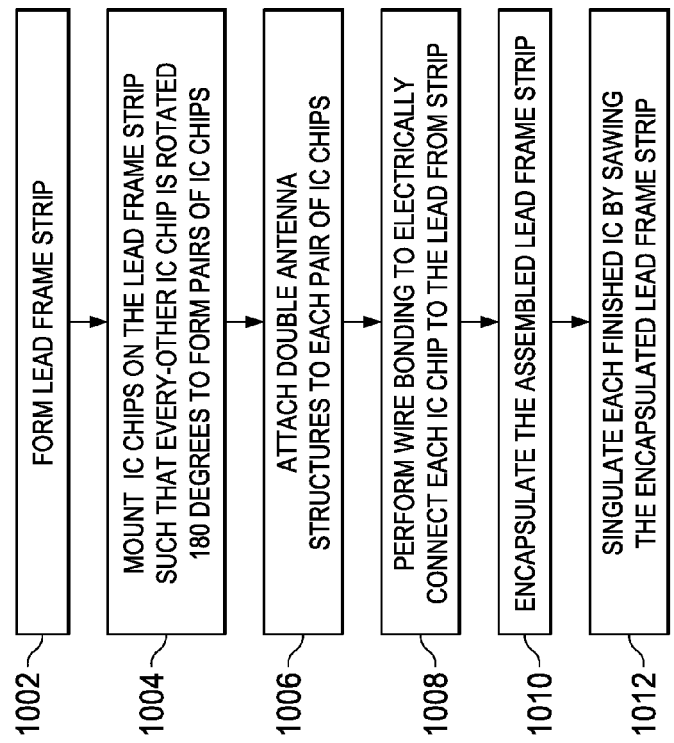

FIGS. 9 and 10 illustrate a process for manufacturing the devices illustrated in FIGS. 6-8. In this example, an IC similar to IC 710 is produced, but a similar process may be used to produce ICs similar to IC 610 and 810, for example.

Typically, a leadframe strip 912 is formed 1002 by etching or stamping a sheet of copper or other conductive material to form a set of contact pads for each IC chip. Typically, multiple leadframe blanks are formed in a strip.

A pick and place machine may then be used to mount 1004 IC chips on the lead frame strip 912. In this example, an IC chip 711 is placed as shown. An adjacent IC chip 911 is first rotated 180 degrees and then placed adjacent IC chip 711 in the next position on leadframe strip 912, as shown. Similarly, pairs of IC chips 711, 911 are placed along the length of leadframe strip 912.

A pick and place machine may then place 1006 a double antenna structure 920 between each pair of IC chips 711, 911. Double antenna structure 920 has two reverse image antennas that are each equivalent to antenna structure 720 and arranged so that they align with bond pads on IC chip pair 711, 911. Solder 722, conductive adhesive, or other known or later developed techniques may be used to conductively couple one portion of double antenna structure 920 to signal pads on IC chip 711. Similarly, solder 922, conductive adhesive, or other known or later developed techniques may be used to conductively couple the reverse image portion of double antenna structure 920 to signal pads on IC chip 911.

A wire bonding machine may then make 1008 wire connections between bond pads on each IC chip and corresponding bond pads on leadframe strip 912, keeping in mind that every-other IC chip is rotated 180°.

The entire leadframe strip assembly is then encapsulated 1010 in molding material using a known or later developed molding process. Each finished IC is then singulated 1012 from the encapsulated leadframe strip using a known or later developed sawing process to make cuts such as cuts 950-952 to separate each IC 710(1)-710(4), for example. As described above in more detail, this allows a dipole antenna or a more complex multi-element antenna to be provided that may lie in a plane that is approximately centered on the core of an adjacent DWG.

Figure 11:
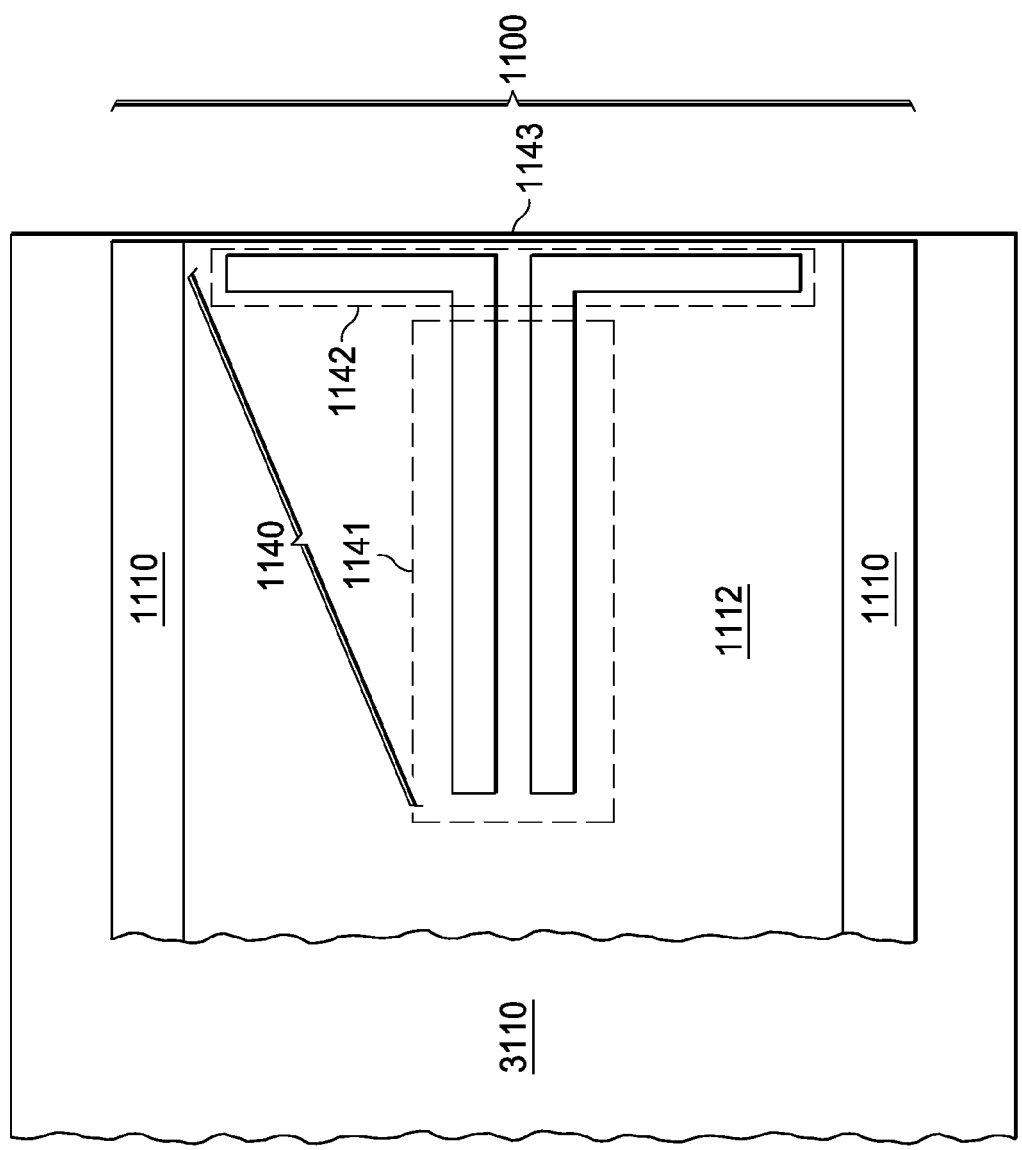
FIG. 11 illustrates system that includes a waveguide that has a dipole antenna structure and radiating elements embedded near and end of waveguide.

FIG. 11 illustrates a waveguide 1100 that has a dipole antenna structure 1142 and radiating elements 1141 embedded near and end of waveguide 1100. A flexible waveguide configuration may have a core member made from flexible dielectric material with a high dielectric constant and be surrounded with a cladding made from flexible dielectric material with a low dielectric constant. Similarly, a rigid waveguide configuration may have a core member made from rigid dielectric material with a high dielectric constant and be surrounded with a cladding made from dielectric material with a low dielectric constant. While theoretically, air could be used in place of the cladding, since air has a dielectric constant of approximately 1.0, any contact by humans, or other objects may introduce serious impedance mismatch effects that may result in signal loss or corruption. Therefore, typically free air does not provide a suitable cladding.

As mentioned above, it is beneficial to match the impedance of a dielectric waveguide with its launching mechanism, such as antenna structure 320, 523, 524, 623, 624, 720 or 820 described above in more detail, for example. This is useful in order to allow an optimum power transfer of the signal between the antenna and the dielectric waveguide. Polymer material commonly used to fabricate the dielectric core of a waveguide has a dielectric constant value that is typically in the range of 2.4-12, with lower values being more common and therefore less expensive. The impedance of a DWG using a commonly available polymer material having a dielectric constant of approximately 3.0 for signals in the range of 100 GHz may be approximately 200-500 ohms depending on permittivity, permeability, and overall size and shape of the dielectric core. A dipole antenna such as some of the antenna structures described above may have a characteristic impedance of approximately 73 ohms, for example. Such a mismatch in impedance may reduce the coupling efficiency between an antenna and a typical DWG.

In this example, DWG 1100 has a dipole antenna 1142 embedded in the end of DWG 1100. Dipole antenna 1142 is designed to have an impedance of approximately 73 ohms and therefore may match the impedance of the dipole antenna structures embedded in an encapsulated IC described above. Parallel radiating elements 1141 may be configured to have an impedance in the range of 200-500 ohms and thereby match the impedance of DWG 1100. This configuration allows dipole antenna 1142 to couple to dipole antenna in an encapsulated IC and receive or transmit sub THz signals produced or received by high frequency circuitry within the IC, for example. Dipole antenna 1142 and radiating elements 1141 will be collectively referred to herein as radiating element 1140.

In this example, dipole antenna 1100 is a half-wave dipole antenna which is an efficient dipole design. In order to design a half-wavelength dipole antenna, the dielectric constant of the environment around the antenna should be calculated or simulated to determine an effective dielectric constant value for the region around the antenna. The total length of the dipole antenna may then be selected to be a half wavelength at the frequency of operation (center of band) at this particular or effective dielectric constant. The effective dielectric constant to use for the antenna design is the effective dielectric constant that the antenna "sees" around it. If the antenna is in free space the effective dielectric constant is 1. If the antenna is embedded by an infinite polymer then the effective dielectric constant is the one of the dielectric. In this case, the antenna is embedded in a finite DWG so the effective dielectric constant will be somewhat different than that of the dielectric constant of the DWG due to the air or other material surrounding the DWG.

In general, an efficient embedded radiating element will have dimensions in the order of, or a substantial fraction of, the wavelength of the EM radiation at that frequency in an effective dielectric constant affected not only by the material in which the antenna is embedded to but also by its surroundings assuming that the DWG has a finite dimension and the antenna is close to the end of the DWG. Equation (1) provides a rough estimate for the largest dimension L of half-wave dipole antenna 1142.

$$L = \frac{\frac{\lambda}{2}}{\sqrt{\varepsilon\_\text{effective}}} \quad (1)$$

where lambda is the free space wavelength, and epsilon_effective is the average of the material permittivities in the surrounding space.

Since dipole antenna 1142 is hardwired to radiating elements 1141, a signal received on dipole antenna 1142 may then be launched into DWG 1100 by radiating elements 1141. Similarly, a signal traveling along DWG 1100 may be captured by radiating elements 1141 and then be radiated by dipole antenna 1142. In this manner, coupling efficiency between DWG 1100 and signal launching mechanisms in encapsulated ICs described above may be improved.

A DWG with an embedded antenna may be fabricated using an additive process such as 3D printing, for example. DWGs with embedded antennas are described in more detail in U.S. patent application Ser. No. 14/521,443, entitled "Dielectric Waveguide with Embedded Antenna", Benjamin S. Cook, et al, filed Oct. 22, 2014, which is incorporated by reference herein.

As described in the above disclosure, extremely low cost systems may incorporate DWG technology by forming an antenna structure within an IC that is supported by molding compound used to encapsulate the IC. The molding compound may have a dielectric constant value that is selected to be approximately equal to a dielectric constant value of a DWG that may be placed adjacent the IC to transmit signals to or from the antenna in the IC.

OTHER EMBODIMENTS

While the invention has been described with reference to illustrative embodiments, this description is not intended to be construed in a limiting sense. Various other embodiments of the invention will be apparent to persons skilled in the art upon reference to this description. For example, the substrate on which a dielectric core waveguide is formed may be rigid or flexible, for example.

While singulation by sawing was described herein, other processes may be used to perform singulation, such as: laser cutting, high pressure water cutting, plasma cutting, etc., for example.

In another embodiment, an adjacent chip may provide a dummy bond pad to support an extended antenna structure. In this case one antenna may be applied for each unit that bridges into the saw singulation area, such that the antenna is still defined by the saw-singulation of the package so as to maximize the wave transmission into the DWG. In this embodiment, adjacent chips do not need to be rotated by 180-degree.

In another embodiment, a supporting structure other than the adjacent chip may be used. In this case one antenna may be applied for each unit that bridges into the saw singulation area, such that the antenna is still defined by the saw-singulation of the package so as to maximize the wave transmission into the DWG. In this embodiment, adjacent chips do not need to be rotated by 180-degree.

The dielectric core of the conductive waveguide may be selected from a range of approximately 2.4-12, for example. These values are for commonly available dielectric materials. Dielectric materials having higher or lower values may be used when they become available. The molding compound may be selected to have a dielectric constant value that is approximately equal to a value or a midpoint of a range of dielectric constant values that may be selected for a DWG, for example.

While waveguides with polymer dielectric cores have been described herein, other embodiments may use other materials for the dielectric core, such as ceramics, glass, paper, etc., for example.

In some embodiments, a conductive coating may be laminated or otherwise applied over the cladding to provide further signal isolation to the DWG.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. An electronics system comprising an encapsulated integrated circuit, the encapsulated integrated circuit comprising:
    a lead frame;
    an integrated circuit (IC) chip mounted on the lead frame, the IC chip having transceiver circuitry operable to produce and/or receive a radio frequency (RF) signal, wherein bond pads on the IC chip are coupled to the transceiver input/output (IO) circuitry;
    an antenna structure coupled to the IO circuitry via the bond pads; and
    mold material encapsulating the IC chip and the antenna structure, wherein the antenna structure is positioned so as to be adjacent an interface edge of the encapsulated IC chip;
    wherein the antenna structure comprises a radiating element on one surface of a substrate and a reflector element on an opposite surface of the substrate.

2. The encapsulated IC of claim 1, wherein the antenna structure is mounted parallel to and in close proximity to the interface edge of the encapsulated IC package.

3. The encapsulated IC of claim 1, wherein the antenna structure is mounted perpendicular to and in close proximity or exposed to the interface edge of the encapsulated IC package.

4. The encapsulated IC of claim 3, wherein one end of the antenna structure is coupled to and supported by bond pads on the IC and the other end of the antenna structure is supported only by the mold material.

5. The encapsulated IC of claim 3, wherein one end of the antenna structure is coupled to and supported by bond pads on the lead frame and the other end of the antenna structure is supported only by the mold material.

6. An electronics system comprising an encapsulated integrated circuit, the encapsulated integrated circuit comprising:
    a lead frame;
    an integrated circuit (IC) chip mounted on the lead frame, the IC chip having transceiver circuitry operable to produce and/or receive a radio frequency (RF) signal, wherein bond pads on the IC chip are coupled to the transceiver input/output (IO) circuitry;
    an antenna structure coupled to the IO circuitry via the bond pads; and
    mold material encapsulating the IC chip and the antenna structure, wherein the antenna structure is positioned so as to be adjacent an interface edge of the encapsulated IC chip;
    a substrate having a top surface, wherein the encapsulated IC is mounted on the top surface of the substrate; and
    a dielectric waveguide (DWG) formed on the top surface of the substrate with an end of the DWG adjacent to the interface edge of the encapsulate IC;
    wherein the DWG has a second antenna structure embedded in the end of the DWG.

7. A method for fabricating an integrated circuit, the method comprising:
    forming a lead frame strip;
    mounting a plurality of integrated circuit (IC) chips on the lead frame, wherein the plurality of IC chips are arranged as pairs such that one IC chip in each pair is rotated 180 degrees with respect to an adjacent IC chip in the pair;
    coupling an antenna structure between each pair of IC chips;
    encapsulating the lead frame strip, plurality of IC chips, and antenna structures with a molding compound; and
    singulating the encapsulated lead frame strip to form a plurality of encapsulated IC chips, such that each antenna structure is cut in half at an interface edge of the plurality of encapsulated ICs.

8. The method of claim 7, further comprising selecting the molding compound to have a dielectric value that is within a range of 15-60.

9. The method of claim 7, wherein the antenna structure is one or more bond wires, and wherein coupling the antenna structure between each pair of IC chips comprises attaching one end of the bond wire to a bond pad on one of the pair of ICs, and attaching an opposite end of the bond wire to a bond pad on the other one of the pair of ICs.

10. The method of claim 7, wherein the antenna structure is a substrate, and wherein coupling the antenna structure between each pair of IC chips comprises coupling one end of the substrate to a bond pad on one of the pair of ICs, and coupling an opposite end of the substrate to a bond pad on the other one of the pair of ICs.

11. The method of claim 7, further comprising:
    mounting at least one of the encapsulated ICs on a surface of substrate; and
    forming a dielectric waveguide (DWG) on the surface of the substrate using an additive process, wherein an antenna is formed by the additive process in an end of the DWG adjacent the interface edge of the encapsulated IC.

* * * * *